United States Patent [19]

Schreck et al.

[11] Patent Number: 5,151,880
[45] Date of Patent: Sep. 29, 1992

[54] METHOD AND APPARATUS FOR DETERMINING THE FIELD POSITION OF AN INTEGRATED CIRCUIT WITHIN A RETICLE AREA

[75] Inventors: John F. Schreck; Phat C. Truong, both of Houston, Tex.

[73] Assignee: Texas Instruments Incorporated, Dallas, Tex.

[21] Appl. No.: 450,808

[22] Filed: Dec. 14, 1989

[51] Int. Cl.$^5$ .................................. G11C 13/00
[52] U.S. Cl. .......................... 365/201; 365/185; 365/218; 371/10.1
[58] Field of Search ............... 365/201, 185, 218; 371/10

[56] References Cited

U.S. PATENT DOCUMENTS 4,967,393  10/1990  Yokoyama et al. .................. 365/218

*Primary Examiner*—Terrell W. Fears
*Attorney, Agent, or Firm*—W. James Brady, III; Lawrence J. Bassuk; Richard L. Donaldson

[57] ABSTRACT

Apparatus for determining the field position (00, 01, 10, 11) of an integrated circuit (18) within a reticle area (12) which contains a plurality of such integrated circuits (14-20) includes a plurality of memory cells (76, 80) formed within the integrated circuit (18) for encoding the field position. Circuitry (40, 94, 100, 104, 106) is provided for reading the states of the memory cells to ascertain the field position.

28 Claims, 3 Drawing Sheets

METHOD AND APPARATUS FOR DETERMINING THE FIELD POSITION OF AN INTEGRATED CIRCUIT WITHIN A RETICLE AREA

TECHNICAL FIELD OF THE INVENTION

This invention relates in general to semiconductor fabrication techniques, and more particularly to a method and apparatus for determining the field position of an integrated circuit within a reticle area containing a plurality of integrated circuits.

BACKGROUND OF THE INVENTION

Integrated circuits are formed at the face of a semiconductor wafer. It is usual to form a large number of integrated circuits on the wafer at the same time. In the instance where the integrated circuits, or groups of them, are identical to each other, it has become common practice to use a reticle for imaging various masking, etching and deposition steps in the fabrication of the integrated circuit. The reticle is "stepped" from location to location on the semiconductor wafer such that identical integrated circuits or groups of integrated circuits are formed. This saves the considerable expense and technical problems involved in designing and using a set of masks for the entire semiconductor wafer surface.

More recently, it has become common practice to fabricate several integrated circuits, which may or may not be identical to each other, within one reticle area. In the instance where integrated circuits are identical to each other, defects can be present in certain of the integrated circuits formed within a single reticle area that are not present in the other circuits in the reticle area. These differences in defect occurrence can result in different quality and reliability characteristics. Because these differences exist, it would be useful to keep a record of which field location, or position within the reticle, an integrated circuit came from.

SUMMARY OF THE INVENTION

The present invention provides a method and apparatus for determining the field position of an integrated circuit within a reticle area. The apparatus includes a plurality of memory cells formed within the integrated circuit for encoding a field position of the integrated circuit with respect to the reticle in which it is formed. Circuitry is provided for reading the states of the memory cells to ascertain this field position.

These cells may be implemented in any of several different ways. In a preferred embodiment and as applied to an electrically programmable read only memory array, links are preprogrammed during the time of array fabrication to connect to either a high voltage level or to a voltage level near ground. An input signal indicative of a special test mode is applied to the gates of a pair of pass transistors associated with the cells, and another pair of gates of output transistors are toggled such that the value of each field position memory cell bit may be accessed. In this manner, a number of bits may be read to ascertain the electric field location of the EPROM with respect to its position inside of an electric field reticle that contains several such EPROMs.

The present invention confers a technical advantage in that a defect recurring throughout a portion of otherwise identical integrated circuits can be isolated to a particular field location within the fabrication reticle area. This in turn allows easier device correction and quality control.

BRIEF DESCRIPTION OF THE DRAWINGS

Further aspects of the invention and their advantages will be discerned upon reference to the following detailed description in conjunction with the appended drawings, in which like characters identify like parts, and in which.

DETAILED DESCRIPTION OF THE INVENTION

Figure 1:
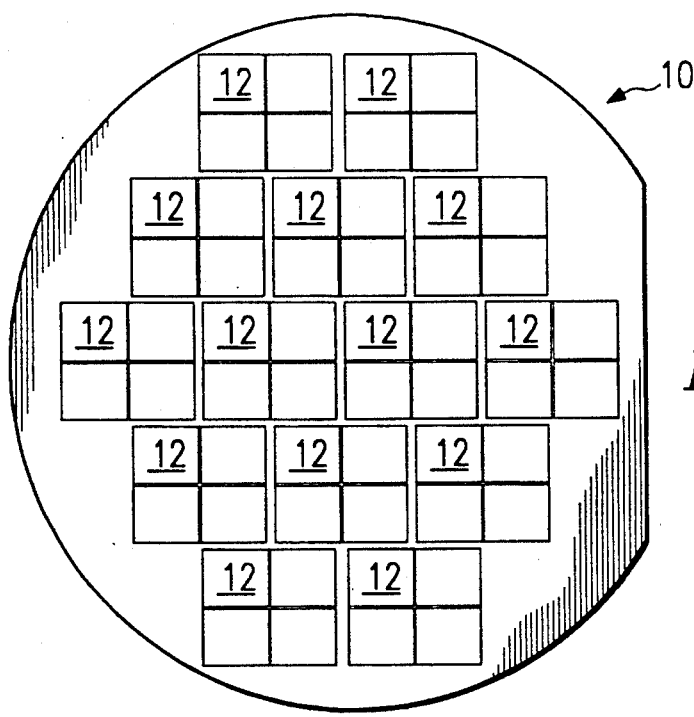
FIG. 1 schematic plan view of a semiconductor wafer showing the positioning of a plurality of reticle areas thereon.

FIG. 1 is a schematic illustration of a semiconductor wafer indicated generally at 10. A plurality of reticle areas 12 are disposed on the surface of the wafer 10. In the illustrated embodiment, reticle areas 12 are positioned in a way that they will all fit on the surface of the wafer 10 with a minimum of unused area.

The reticle producing reticle area 12 is associated with a series of masks for successive processing steps. The reticle is stepped from one reticle area 12 to the next such that the process details inside each reticle area 12 will be exactly repeated throughout the wafer 10.

Figure 2:
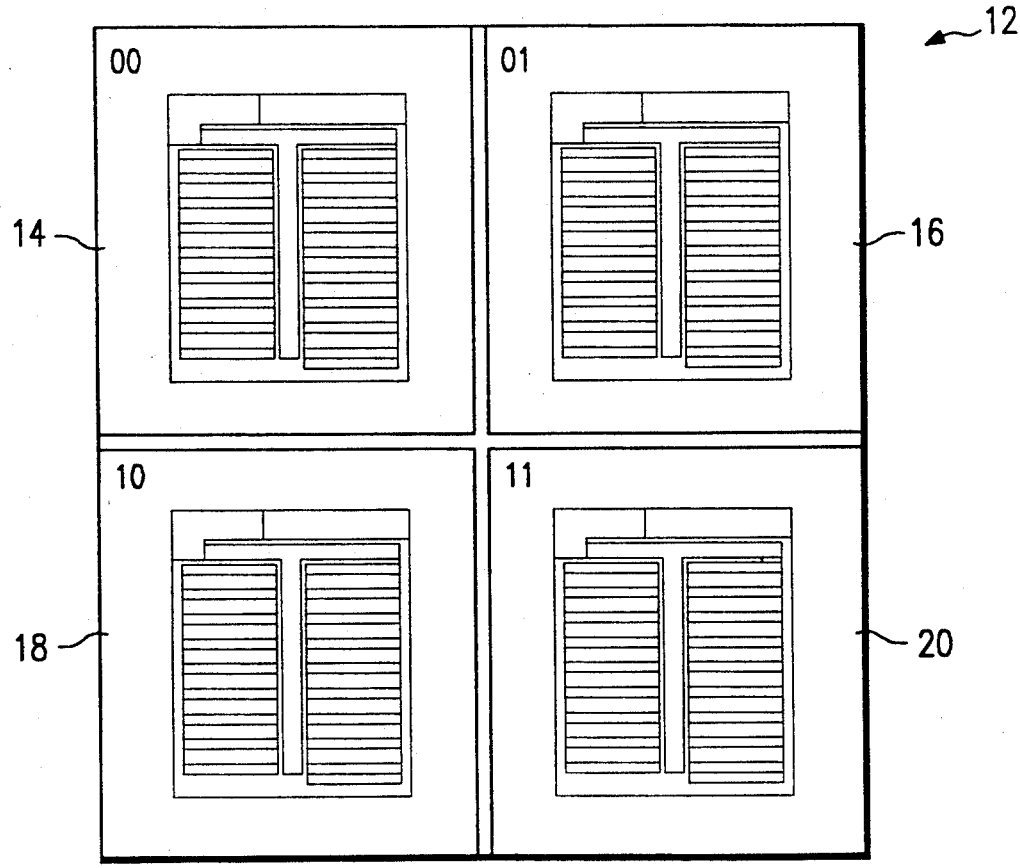
FIG. 2 is an enlarged schematic view of a single reticle area like those shown in FIG. 1, showing its division into a plurality of chips or dies.

In prior semiconductor fabrication practice, each reticle usually resulted in the fabrication of one chip or die. Currently, each reticle may include a plurality of such chips or dies, which usually are intended to be identical to each other. A reticle area produced by such a reticle is indicated generally at 12 in FIG. 2 and consists of four dies 14–20. Each die is identified with a 2-bit field location. In the illustrated embodiment, the upper left hand die 14 is identified with 00, die 16 is identified with 01, die 18 is identified with 10 and die 20 is identified by 11. In alternative embodiments, the reticle area 12 may comprise more or less dies than are shown in FIG. 2. If only two dies existed within one reticle area 12, then only one bit of an identifying code would be necessary; between 5 and 8, three bits; between 9 and 16, four bits; etc. The concept of the present invention is not limited to the illustrated four-chip-per-reticle area embodiment.

Figure 3:
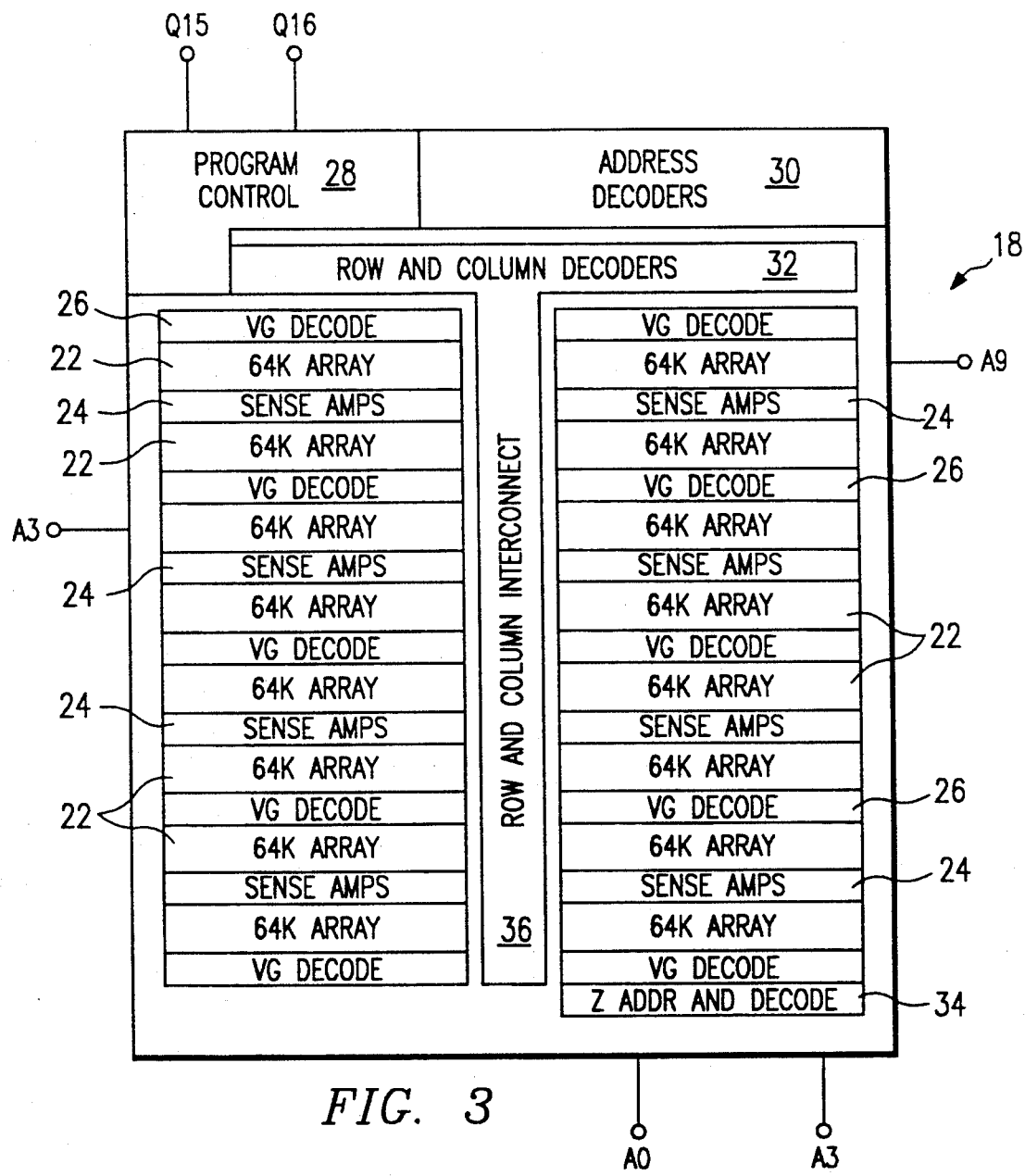
FIG. 3 is a schematic plan view of central portions of a single chip or die, showing physical positioning of certain circuit blocks and including certain inputs and outputs to and from the chip that are relevant to the illustrated embodiment of the invention.

Turning next to FIG. 3, a selected chip 18 is illustrated in more detail, showing the physical location of certain circuit blocks in the central area of the chip, as well as inputs and outputs connected to the chip when completely fabricated that are relevant to the operation of the invention in this embodiment. In the illustrated embodiment, chip 18 is an electrically programmable read only memory (EPROM), although the present invention may be applied to any integrated circuit having a multiple number of dies per reticle. The EPROM 18 is a one meg EPROM part that is subdivided into sixteen 64K array sections 22. These array sections 22 are organized in a higher order array of two columns and eight rows of array sections 22.

A plurality of sense amplifier sections 24 are disposed between pairs of the 64K array sections 22. Each sense amplifier section 24 contains 32 sense amplifiers each for sensing the states of a respective plurality of respective bit lines (not shown) within the adjacent memory cell array sections 22. Each 64K array section 22 also borders on a virtual ground decoding section 26 that decodes which of the array sources in an adjacent array section 22 will be pulled to ground.

Program control circuitry for the chip is located within a block 28 in the upper left hand corner of the chip. Address inputs are routed to either an address decoder section 30 or to a Z address and decoder section 34, depending on their function. Inputs A0 and A3 are routed to section 34 while A9 is routed to section 30. Address decoder section 30 is further connected to outputs Q1–Q16, of which only outputs Q15 and Q16 are shown. The address inputs A0, A3 and A9, and the outputs Q15 and Q16 are represented by their approximate pinout positions on the periphery of the chip 18, and the routing between them and the decoder sections 30 and 34 has been omitted for clarity. The address decoder section 30 is coupled to a row and column decoder section 32. This section decodes a particular row of cells (X) and the particular column of cells (Y) in each array section 22, thereby partially selecting a particular memory cell in each of the 64K arrays 22. The Y selection accomplished by the row and column decoder section 32 does not however complete the selection of a particular column of cells. To complete the selection of a column, a Z address and decoder section 34 is provided that is disposed in the illustrated embodiment in the lower right hand corner of the chip. A combination of the Y and Z signals select a particular column within each 64K array section 24. The row and column decoder section 32 and the Z address and decoder section 34 are connected to the sense amplifier and virtual ground decoder sections 24 and 26 through a row and column interconnect area 36.

In normal operation, input A3 is used internally to select $Z_i$. This input is therefore routed to the Z address and decoder section 34 together with signals A0 and A9. Input A0 in normal operation is used internally as a part of the memory array column selection process.

As will be explained in further detail in conjunction with FIGS. 4 and 5, the A3 and A0 signals perform different functions within each sense amplifier section 24 that require different signal routing. A0 is used to decode a memory location before the sense amplifier, while signal A3 is used to decode the sense amplifier output. Nonetheless, in the illustrated embodiment, signal A0 is used in selecting each of the two bits located within each sense amplifier section 24 for reading the "signature", field location and other data relating to chip 18. It is therefore advantageous to use the physical A3 signal routing as switched over to the A0 input.

Figure 4:
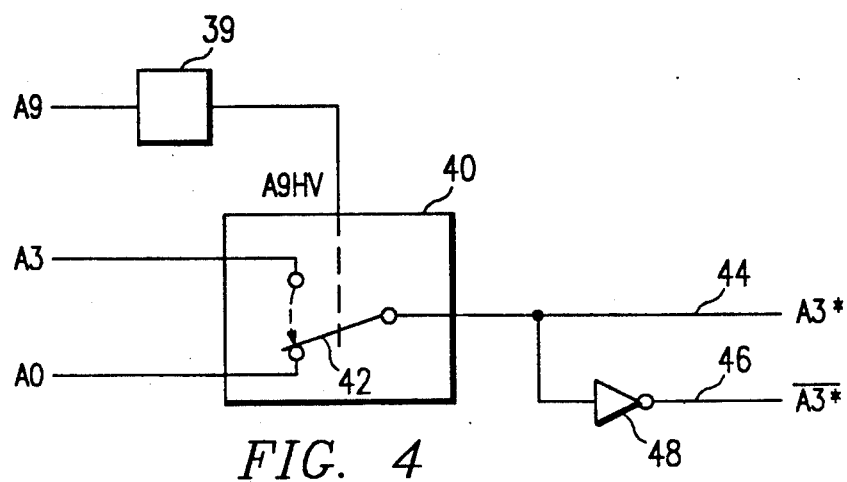
FIG. 4 is an electrical schematic diagram of an input buffer for changing operational states of the chip between normal operation and a special test mode.

FIG. 4 is a high-level schematic electrical circuit diagram of an input buffer in Z decoder section 34 showing how this switch over may be accomplished. A test mode signal input on A9 is input to a high voltage sensor 39. An output A9HV controls a logical switch 40. The logical switch 40 has an A3 input and an A0 input, and a "blade switch" 42 that is controlled to connect to one of the two. The output of logical switch 40 is A3*, which is made available in its true state on line 44, and in its complement state on line 46 after passing through an inverter 48.

The illustrated logical switch 40 has been greatly simplified from the actual circuitry used, as any of several variants of the circuitry actually used is within the skill of one having ordinary skill in the art.

A high voltage state on input A9 is indicative of a special "signature" mode that allows the chip programmer to store the "signature" of the chip, the electric field location, and other possible data associated with the chip.

A high state on input A9 will cause a high state of A9HV, which in turn will cause the state on input A0 to be reflected on output A3*. A low state on A9HV will cause input A3 to be connected to output A3* for normal operation use in the Z-decoding function.

Figure 5:
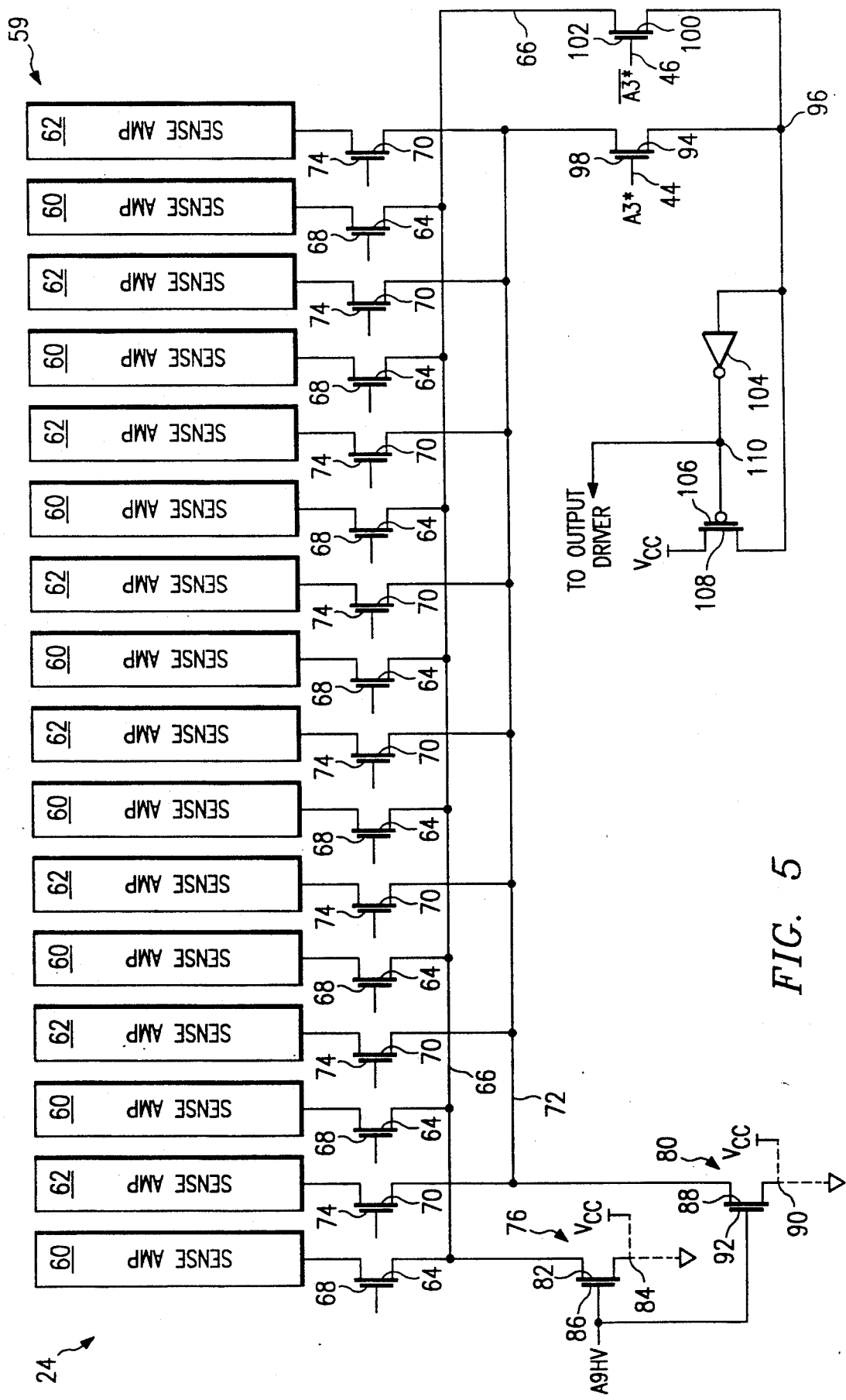
FIG. 5 is an electrical schematic diagram of a sense amplifier section in the embodiment illustrated in FIG. 3, showing the provision of field position memory cells.

Lines 44 and 46 are routed through the row and column interconnect section 36 to each individual sense amplifier section 24, one of which is schematically illustrated in FIG. 5.

Turning then to FIG. 5, a schematic electrical diagram of a half-section 59 of a sense amplifier section 24 is shown. The sense amplifier half-section 59 comprises eight sense amplifiers 60 as interleaved with eight other sense amplifiers 62. Each sense amplifier 60 has an output that is connected through the current path of a respective transistor 64 to a sense amplifier output line 66. Gates 68 of the sense amplifier output transistors 64 are connected to respective decoding signals for selecting one out of the eight sense amplifiers 60 during normal read mode. In a similar manner, each sense amplifier 62 has an output connected through the current path of a respective transistor 70 to a second sense amplifier output line 72. Gates 74 of the sense amplifier output transistors 70 are connected to respective decoding signals such that one out of the eight sense amplifiers 62 is selected for output during normal read mode.

A read-only memory cell 76 includes a pass gate transistor 82 having a current path selectively connecting the sense amplifier output line 66 to a node 84. A gate 86 of the transistor 82 is connected to a test mode signal A9HV, which is routed to each sense amplifier section 24 for this purpose. The node 84 is selectively programmed at the time of fabrication to be connected to either a supply voltage source $V_{cc}$, or alternatively to ground or $V_{ss}$.

In the illustrated embodiment, the node 84 is actually a diffused n+ region (not shown) formed at the surface of the semiconductor wafer 10 and to which a contact is made. The metallization is programmed such that a metal line runs to a source of $V_{cc}$ or alternatively to $V_{ss}$.

A read-only memory cell 80 is constructed similarly. A pass gate transistor 88 of cell 80 has a current path for selectively connecting the second sense amplifier output line 72 to a node 90. A gate 92 of the transistor 88 is connected to the input signal A9HV. The node 90 is selectively programmed at the time of fabrication to be connected to either $V_{cc}$ or to a ground source ($V_{ss}$).

A transistor 94 has a current path selectively connecting the sense amplifier output line 72 to a common sense amplifier output node 96. A gate 98 of the transistor 94 is connected to line 44, which carries the A3* signal. The sense amplifier output line 66 is connected to the common output node 96 through the current path of another transistor 100. A gate 102 of this transistor 100 is connected to line 46, which carries the $\overline{A3^*}$ signal. During normal chip operation, transistors 94 and 100 determine which of the two outputs already selected by transistors 64 and 70 will be passed to node 96.

The common output node 96 is connected to an input of an inverter 104, which in turn has an output which is applied to a gate 106 of a p-channel field effect transistor 108. The current path of the p-channel transistor 108 selectively connects $V_{cc}$ to a node 96. Node 110 is supplied to the output driver of an appropriate one of the outputs Q1–Q16, depending on the sense amplifier section 24 involved.

In special test mode operation, a high signal on A9HV (FIG. 4), indicative of a special test mode, causes the logical switch 40 to connect its output A3* to input A0. The signal A3* is made available on line 44, while its inverse $\overline{A3*}$ is made available on line 46.

Returning to FIG. 5, the signals A3* and $\overline{A3*}$ are respectively applied to transistors 94 and 100, rendering one of these transistors conductive and the other transistor nonconductive. Gates 68 and 74 are held low to isolate the sense amplifier outputs from the output lines 66 and 72. For reading the state of cell 80, the signal A3* is held high while $\overline{A3*}$ is correspondingly low. The high state of signal A9HV is applied to the gates 86 and 92 of respective pass transistors 82 and 88. Depending on the preprogrammed connection of node 90, the sense amplifier output line 72 will either be at a state near $V_{cc}$ or at a state near $V_{ss}$. This is passed by the current path of transistor 94 to the output node 96. In the instance that output node 96 is near $V_{cc}$, the inverter 104 and the p-channel transistor 108 will pull the voltage value at node 96 up to a full $V_{cc}$. Otherwise, a $V_{ss}$ value is passed to the output driver.

To read the state of cell 76, A0 (FIG. 4) is then toggled to the opposite state. This causes $\overline{A3*}$ to be high and A3* to be low turning on transistor 100 (FIG. 5) and turning off transistor 94. The voltage value of sense amplifier output line 66 will be at a value close to either $V_{cc}$ or $V_{ss}$, depending on which of these voltage sources the node 84 has been connected to during fabrication. The voltage value on output line 66 is passed by the current path of transistor 100 to the output node 96 as before. In this manner, each of two read-only memory bits may be read.

During normal operation, A9HV is low and transistors 82 and 88 are inactive. The logical switch 40 (FIG. 4) connects A3 to its output A3*. A3* and $\overline{A3*}$ (FIG. 5) operate the gate end transistors 94 and 100 to alternately connect the outputs of a selected two of the 16 sense amplifiers 60 and 62 to the output node 110.

As previously mentioned, each half-section 59 is duplicated to make up an entire sense amplifier section 24. Hence there are four special read-only memory cells 76 and 80 per sense amplifier section 24, and therefore, thirty-two on the entire chip 18 (FIG. 3). Sixteen of the thirty-two cells 76 and 80 are used to store a "signature" of the chip 18 (FIG. 3), which includes a manufacturer's code and a device type. The thirty-two cells are organized into two two-byte test words, each byte having eight bits. In each of the two test words, the lower byte (comprising eight least significant bits) are used for storing the "signature", while the eight most significant bits may be used for other data, including electric field location. Each test word is output on outputs Q1–Q16 (only Q15 and Q16 of which are shown in FIG. 3), each output corresponding to a sense amplifier half section. The "signature" appears on outputs Q1–Q8 (not shown), while the electric field location and other data appear on outputs Q9–Q16.

In the preferred embodiment, the cell 76 within a particular half-section 59 of a selected one of the sense amplifier sections 24 stores one of the two electric field position bits. Another cell 76 in the other half-section 59 (not shown) of the selected sense amplifier 24, stores the other electric field location bit. Cells 80 in the illustrated embodiment do not store "signature" bits, but instead are available for storing other possible information such as revisions, data codes and process changes.

In the illustrated embodiment, the output driver 110 shown in FIG. 5 is connected to an output pin Q15, while a mirror-image output driver in the other sense amplifier half-section of section 24 is connected to output pin Q16. Signal A3* is a test word selector signal that selects which of two sixteen-bit test words will be output to outputs Q1–Q16. Cell 76 belongs to one test word, while cell 80 belongs to the other test word. When signal A3* is toggled low, causing the connection of node 66 to node 96, the state of node 84 within cell 76 may be accessed upon the application of a high state of A9HV to the gate 86. In this way, the two electric field location bits are output to outputs Q15 and Q16, respectively. When A3* is toggled high, the contents of the cell 80 and its mirror image within the sense amplifier section 24 are read to put out other information on outputs Q15 and Q16. The "signature" code stored in the two lower bytes Q1–Q8 of the respective two words, are not stored within the illustrated cells 76 and 80 or their mirror images, but in other like cells in the other sense amplifier sections 24. As long as $\overline{A3*}$ is high, the signal A0 (FIG. 4) does not need to be toggled between two states in order to ascertain both bits of the electric field position.

In summary, a method and apparatus have been disclosed for uniquely identifying the field location of a particular chip or die within a reticle area, and more specifically for incorporating this apparatus into an EPROM sense amplifier such that a minimum of additional circuitry is required.

While an illustrated embodiment and its advantages have been described in the above detailed description, the invention is not limited thereto but only by the scope and spirit of the appended claims.

What is claimed is:

1. Apparatus for determining the field position of an integrated circuit within a reticle area containing a plurality of integrated circuits, comprising:
   a plurality of memory cells formed within said integrated circuit for encoding said field position; and
   circuitry for reading the states of said memory cells to ascertain said field position in response to a predetermined state of a test mode signal.

2. The apparatus of clam 1, wherein each memory cell comprises a link programmed at the time of fabrication of said integrated circuit to couple a selected one of a high voltage source and a low voltage source substantially different from said high voltage source to said circuitry for reading.

3. The apparatus of claim 2, wherein each said memory cell further comprises a pass gate and an output node, a current path of said pass gate for selectively coupling said link to said output node, a control electrode of said pass gate having a source of said test mode signal coupled thereto, said predetermined state of said test mode signal rendering said current path conductive.

4. The apparatus of claim 2, and further comprising, for each memory cell, an associated pass transistor having a current path for selectively coupling said link to a common output node and a control electrode, a source of a field position address input signal coupled to said control electrode, a predetermined state of said field position address input signal rendering said pass transistor conductive.

5. The apparatus of claim 4, and further comprising a normal operation address input of said integrated circuit and a field position address input of said integrated circuit, a logical switch having inputs respectively coupled to said normal operation address input and said field position address input, an output of said switch coupled to said control electrode of said pass transistor;

a control input of said switch, a test mode signal input of said integrated circuit chip coupled to said control input, said switch operable to couple said field position address input to said control electrode of said pass transistor in response to said predetermined state of said test mode signal.

6. The apparatus of claim 4, wherein said plurality of memory cells comprises first and second memory cells, a current path of a first pass transistor selectively coupling a link of said first cell to a common output node, a control electrode of said first pass transistor coupled to a source of a field position address input signal.

7. The apparatus of claim 1, wherein said memory cells comprise read-only memory cells.

8. An electrically programmable read-only memory array formed at a face of a semiconductor wafer within a reticle area, comprising:
at least one array of memory cells formed at said face;
a field position memory formed at said face for recording a field position of said array within said reticle area; and
circuitry formed at said face for accessing said field position memory to ascertain said field position in response to a predetermined state of a test mode signal.

9. The array of claim 8, and further comprising a plurality of sense amplifiers formed adjacent said array for sensing the states of a plurality of said cells in said array, said field position memory formed near said sense amplifiers.

10. The array of claim 9, wherein said sense amplifiers have at least one output, at least one output of said field position memory coupled to said output of said sense amplifiers.

11. The array of claim 10, wherein said field position memory comprises at least one pass gate having a current path and a control electrode, one end of said current path coupled to said sense amplifier output, a special test mode signal source coupled to said control electrode, said predetermined state of said special test mode signal causing said current path to become conductive when said array is in said special test mode.

12. The array of claim 9, wherein said sense amplifiers comprise first and second sense amplifiers, outputs of said first sense amplifiers selectively coupled to a first sense amplifier output line, outputs of said second sense amplifiers selectively coupled to a second sense amplifier output line;
a cell of said field position memory having an output coupled to a selected one of said sense amplifier output lines.

13. The array of claim 12, and further comprising a common sense amplifier output node, a first sense amplifier output address transistor having a current path for selectively coupling said common output node to said first sense amplifier output line, a second sense amplifier output address transistor having a current path for selectively coupling said second sense amplifier output line to said common output node, a control electrode of said first sense amplifier output address transistor coupled to a first address input signal source, a control electrode of said second sense amplifier output address transistor coupled to a second address input signal source.

14. The array of claim 13, and further comprising a logical switch, a first input of said logical switch coupled to receive a normal operation sense amplifier decoding signal, a second input of said logical switch coupled to receive a test word selector signal for selecting one of a plurality of test words for output, a plurality of bits of one of said test words comprising field position bits, one of said field position bits stored in said cell;

a control input of said switch receiving a test mode signal, an output of said logical switch coupled to a control electrode of at least one of said output address transistors; and
said switch operable to connect said second input to said output responsive to a predetermined state of said test mode signal.

15. The array of claim 14, wherein said logical switch is formed at said face at a location remote from said sense amplifiers.

16. The array of claim 13, wherein said second input address signal is the complement of said first input address signal.

17. The array of claim 13, and further comprising a plurality of first and second sense amplifier output transistors each having a current path and a control electrode, the current paths of said first output transistors selectively coupling respective outputs of said first sense amplifiers to said first sense amplifier output line, current paths of said second sense amplifier output transistors selectively coupling outputs of said second sense amplifiers to said second sense amplifier output line, a plurality of decoding signals applied to respective ones of said first and second sense amplifier output transistors;

said decoding signals having states to render the current paths of said respective sense amplifier output transistors nonconductive when it is desired to access said field position memory cell, such that said outputs of said sense amplifiers will be isolated from said first and second sense amplifier output lines.

18. A method for ascertaining the field position of an integrated circuit device within a reticle area, comprising the steps of:
programming a field position memory with data encoding one of a plurality of field positions within the reticle area; and
reading the programmed field position memory in order to ascertain the field position.

19. The method of claim 18, and further comprising the steps of:
assigning each of the plurality of field positions a number of binary bits sufficient to uniquely identify each field position; and
programming a plurality of field position memory cells equivalent in number to the number of bits.

20. The method of claim 18, and further comprising the step of programming the field position memory at the time that the integrated circuit device is fabricated.

21. The method of claim 18, wherein all field positions within the reticle may be represented by respective combinations of two binary bits, the method further comprising:
addressing a gate of a first field position memory cell pass transistor with a test word selector signal; and
addressing the gate of a second field position memory cell pass transistor with the test word selector signal.

22. The method of claim 18, wherein said field position memory comprises a plurality of memory cells each having a pass gate, the method further comprising the step of applying a predetermined state of a test mode signal to the pass gate of each cell.

23. The method of claim 18, wherein said integrated circuit comprises an array of memory cells having a plurality of sense amplifiers associated therewith, outputs of a plurality of the sense amplifiers being selectively coupled to a sense amplifier output line, at least one field position memory cell having a pass gate for selectively coupling the field position memory cell to the sense amplifier output line, the method comprising the steps of:
isolating the sense amplifier outputs from the sense amplifier output line; and
applying a predetermined state of a test mode signal to the pass gate to couple the field position memory cell to the sense amplifier output line.

24. The method of claim 23, wherein the sense amplifiers comprise first and second sense amplifiers selectively coupled to respective first and second sense amplifier output lines, a field position memory cell having a pass gate for selectively coupling the field position memory cell to a preselected one of the sense amplifier output lines, each sense amplifier output line selectively coupled through a respective gating transistor to a common output node, the method further comprising:
in normal operation, switching a sense amplifier decoding signal to a control electrode of a first of the gating transistors;
during normal operation, transmitting a complement of the sense amplifier decoding signal to a control electrode of a second of the gating transistors;
during a test mode, switching a test word selector signal to the control electrode of the first gating transistor;
during the test mode, transmitting a complement of the test word selector signal and coupling the complement to the control electrode of the second gating transistor;
during the test mode, isolating the sense amplifier outputs from the first and second sense amplifier output lines; and
during the test mode, coupling the field position memory cell through a respective pass gate to said preselected one of the sense amplifier output lines by applying a predetermined state of a test mode signal to respective control electrodes of the pass gates.

25. An integrated circuit, comprising:
an array of memory cells, said array producing an output signal on an output line during a normal operation mode;
a test mode memory, said test mode memory producing an output signal on said output line during a test mode;
a coupling circuit for coupling said output line to an output node in response to a control signal, said coupling circuit having a control input for receiving said control signal; and
a switch for selectively coupling a normal operation mode address input to said control input in response to a first state of a test mode signal and coupling a test mode address input to said control input in response to a second state of said test mode signal.

26. The integrated circuit of claim 25, in which said test mode memory includes a memory cell having a link programmed at the time of fabrication of said integrated circuit to couple a selected one of a high voltage source and a low voltage source to said output line during said test mode.

27. The integrated circuit of clam 25, in which said test mode memory includes at least one pass gate having a current path and a control electrode, one end of said current path coupled to said output line, a test mode signal source coupled to said control electrode, said second state of said test mode signal causing said current path to become conductive.

28. The integrated circuit of claim 25, in which said coupling circuit includes a pass transistor having a current path for selectively coupling said output line to said output node and a control electrode for receiving said control signal.

* * * * *